United States Patent [19]
Mantkowski et al.

[11] Patent Number: 6,039,810
[45] Date of Patent: Mar. 21, 2000

[54] HIGH TEMPERATURE VAPOR COATING CONTAINER

[75] Inventors: Thomas E. Mantkowski, Madeira; Nripendra N. Das, West Chester; Raymond W. Heidorn, Fairfield; Jackie L. King, Franklin, all of Ohio

[73] Assignee: General Electric Company, Cincinnati, Ohio

[21] Appl. No.: 09/191,660

[22] Filed: Nov. 13, 1998

[51] Int. Cl.[7] ............................. C23C 16/00; F16L 25/00
[52] U.S. Cl. .................... 118/715; 118/715; 118/724; 118/722; 285/258; 285/905; 277/359; 403/30
[58] Field of Search .................... 118/715, 724, 118/722; 156/345; 285/258, 905; 277/359; 403/28, 30

[56] References Cited

U.S. PATENT DOCUMENTS 5,454,363  10/1995  Sata ..................................... 126/263.01
5,678,607  10/1997  Krywitsky ............................... 138/89

*Primary Examiner*—Richard Bueker
*Assistant Examiner*—Liza Pacheco
*Attorney, Agent, or Firm*—Andrew C. Hess; Gerry S. Gressel

[57] ABSTRACT

A high temperature vapor coating container, including a hollow interior, resists distortion and cracking at a vapor coating temperature of at least about 1700° F. as a result of making the container of a nonmetallic material having a coefficient of thermal expansion of less than about $4.5 \times 10^{-6}$ at the vapor coating temperature, the material being nonreactive with the coating vapor at the vapor coating temperature.

7 Claims, 2 Drawing Sheets

HIGH TEMPERATURE VAPOR COATING CONTAINER

BACKGROUND OF THE INVENTION

This invention relates to the high temperature vapor coating of an article, and more particularly, to a container used for such coating.

Certain articles operating at elevated temperatures in an oxidizing atmosphere have been provided with environmental protection in the form of coatings of various types. For example, components such as gas turbine engine turbine blades and vanes operating at high temperatures typically experienced in the turbine section of the engine frequently include metallic surface coatings alone or in various combinations with other materials. Such coatings are capable of resisting the oxidation, corrosion and sulfidation conditions generated during high temperature operation.

Application methods for such coatings include depositing a vapor of one or more protective materials, for example aluminum or alloys including aluminum to provide a form of aluminide coating, on an article surface at high temperatures. Such a method is conducted in a nonoxidizing atmosphere within a coating container or chamber, sometimes called a part of the coating tooling. The coating vapor can be generated within the container in which the article is held or can be generated outside of such container and then introduced into the container to react with a surface of an article to be coated. Generally the container, connected with means to provide the nonoxidizing atmosphere, is placed for coating within a heating means such as a furnace. This type of coating and its associated coating tooling has been described widely in the coating art, particularly as it relates to coating of gas turbine engine components.

It has been a practice in the high temperature vapor coating art to use coating containers made of metal, at least in part because of their good thermal conductivity. However, it has been observed in connection with the use of such metal containers for coating at high temperatures, for example in the range of about 1700–2200° F., that walls of the containers react with the coating vapor, becoming coated themselves along with the article or articles within the container. More importantly, as they become coated the containers frequently distort and crack. As a result, they no longer can be sealed during coating, resulting in loss of coating vapor and failed coating on the article. Consequently, the metal containers must be discarded and replaced periodically, and monitored prior to each use to assure good coating.

BRIEF SUMMARY OF THE INVENTION

The present invention, in one form, provides a high temperature vapor coating container having a hollow interior within which is held at least one workpiece. The coating container also includes means to provide coating vapor within the container. According to the present invention, the container is made of nonmetallic material having a coefficient of thermal expansion of less than about $4.5 \times 10^{-6}$ at a vapor coating temperature of at least about 1700° F. to enable the container to resist distortion and cracking at the vapor coating temperature, and which material substantially is nonreactive with the coating vapor at the vapor coating temperature.

DETAILED DESCRIPTION OF THE INVENTION

The present invention obviates the above described problems associated with currently used metal high temperature vapor coating containers by making the container of a particular type of material as it relates both to the coating vapor and to the coating temperature to be used. The vapor coating container of the present invention, which is used at a coating temperature of at least about 1700° F. and typically in the range of about 1700–2200° F., is of a nonmetallic material which, during coating, substantially is nonreactive with the selected coating vapors. In addition, the material has a coefficient of thermal expansion of less than about $4.5 \times 10^{-6}$ at the coating temperature to enable the container to resist distortion and cracking at the coating temperature. One form of such high temperature coating container provides a differential expansion seal system at a junction between a gas inlet conduit and/or at the junction between a workpiece holder and a bottom portion of the coating container.

Figure 1:
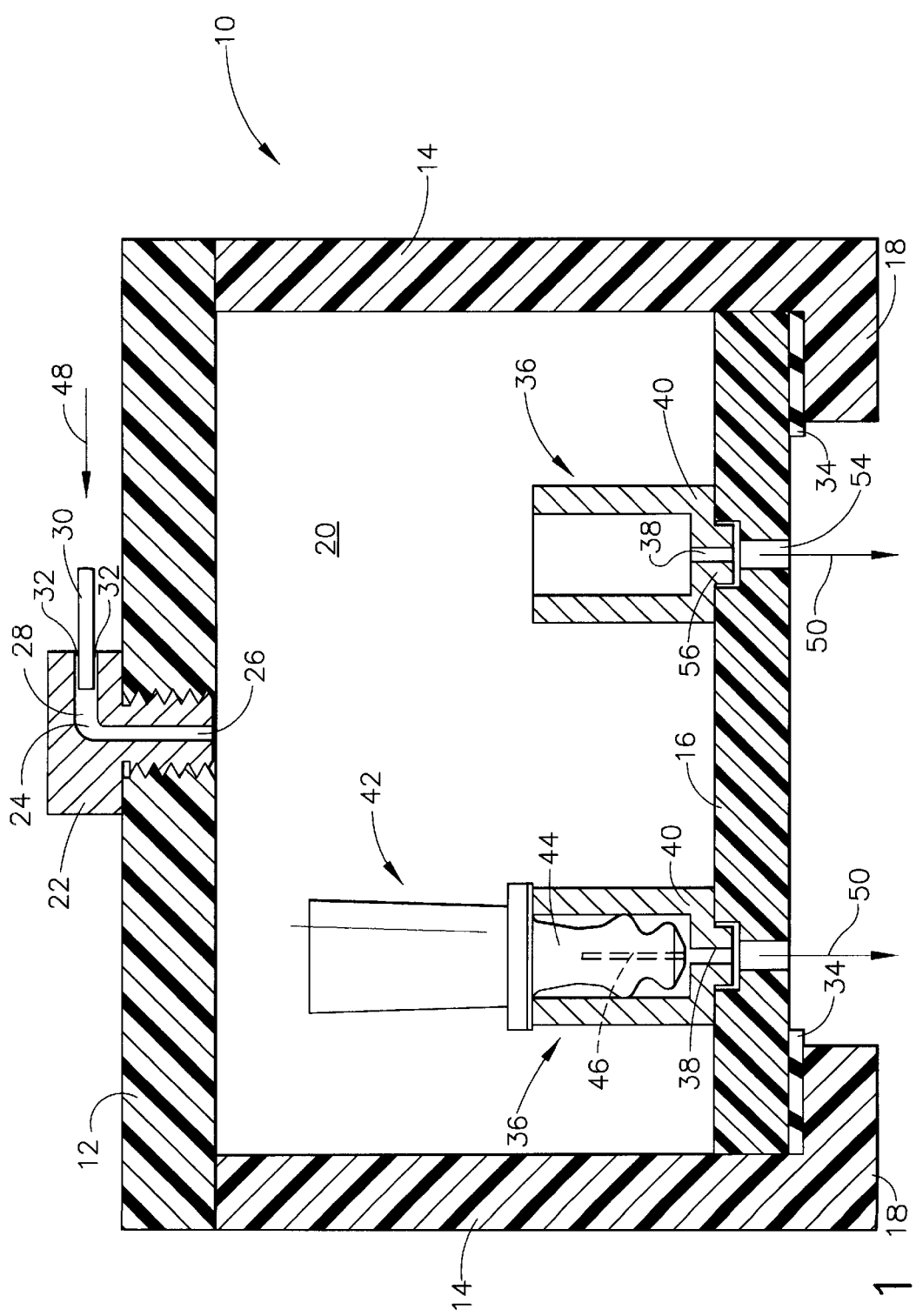
FIG. 1 is a sectional view of a high temperature coating container embodying the present invention.

The present invention will be more fully understood by reference to the drawings. FIG. 1 is a sectional view of one form of the present invention. The high temperature coating container, shown generally at 10 substantially in the shape of a hollow cylinder, includes a circular removable top 12, a side wall 14, and a bottom portion as member 16.

In the form of FIG. 1, bottom member 16 rests upon and is carried by flange 18 of side wall 14. Top 12, side wall 14 and bottom member 16 cooperate to define a container hollow interior 20. According to one form of the present invention, the top, side wall, and bottom member are made of a nonmetallic material having a coefficient of thermal expansion of less than about $4.5 \times 10^{-6}$ and therefore enables the container to resist distortion and cracking at a temperature of at least about 1700° F., and generally in the range of about 1700–2200° F. In addition, the nonmetallic material is nonreactive with the coating vapor at that temperature. A preferred material for such use is graphite from which the high temperature container of the drawings was made. Carbon based materials such as graphite are particularly preferred for such use because, not only do they have the high temperature dimensional stability and nonreactive properties defined for material of the present invention, but also they have good thermal conductivity sufficient to facilitate efficient transfer of heat into the container from an external heating source, for example a furnace within which the container is placed. For use of a high temperature coating container within a furnace, certain other nonmetallic materials such as ceramics are significantly less efficient because of their relatively low heat transfer coefficients. Metal containers, which have been observed to crack and distort as a result of use in high temperature vapor coating, have been used prior to the present invention because of the generally good heat transfer characteristics and the easy fabricability of metals and metal alloys.

The above described graphite coating containers have been evaluated in commercial high temperature vapor aluminiding of gas turbine engine turbine blades. Such articles were held within the container hollow interior in the temperature range of about 1750–2100° F., using an aluminiding coating vapor generated from coating source material held within the container, for example generally as described in U.S. Pat. No. 3,540,878- Levine et al (patented Nov. 17, 1970). One commercial form of such aluminiding sometimes is referred to as Codep aluminide coating. An argon gas nonoxidizing atmosphere was maintained within the container which was heated within a furnace, as currently is practiced in the art. It has been observed in such evaluation of the present invention that such coating containers offer potentially unlimited reuse, with currently evaluated containers exceeding the life of ordinary metal coating containers by at least four times. The graphite containers are free of cracks and distortions, and still are operational. For example, the average life of a metal coating container is about 25 uses. One graphite coating container made according to the present invention has been used in a high temperature aluminiding vapor method 130 times without cracking or distortion and continues to be operational.

With reference to FIG. 1, that form of the invention includes means to introduce a fluid such as a nonoxidizing gas such as argon, or a coating vapor, or their combination, into the container hollow interior through top 12. In that form, a second member or feed plug 22 is secured at a threaded connection through top 12, as shown, thereby providing a labyrinth type gas/vapor seal therebetween. Within and through plug 22 is a fluid flow channel 24, a first end 26 of which communicates with hollow interior 20 and a second end 28 of which receives a first member or fluid flow conduit or tube 30 across a gap 32. Channel 24 was generated by drilling intersecting holes within plug 22. According to one form of the present invention, in order to provide a readily releasable and replaceable connection between plug 22 and flow conduit 30, such as before and after high temperature coating processing, the shape of channel 24 at its end 28 and of tube 30 were matched to enable subsequent registry between tube 30 and channel 24. In addition, the materials from which plug 22 and conduit 30 were made were selected to have different coefficients of thermal expansion. Such difference in thermal expansion characteristics was selected to be sufficient so that when those materials were heated at the coating temperature, gap 32 was closed and a gas seal was provided by registry with or contact between plug 22 and conduit 30 by differential thermal expansion. Also, when cooled such as to about room temperature, gap 32 was reestablished and conduit 30 was releasable from within channel 24. For ease of manufacture to facilitate operation of such a differential thermal seal, both tube 30 and channel 24, at least at end 28, were of circular cross section. One combination of materials which has been used to establish such a differential expansion seal system was making plug 22 from molybdenum, having a coefficient of thermal expansion of about $3\times10^{-6}$, and making tube 30 of A.I.S.I. 304 stainless steel, having a coefficient of thermal expansion of about $10\times10^{-6}$. With this combination of materials in one example, tube 30 was of circular cross section and had a diameter of 0.625", and channel 24 at end 28 was of circular cross section and had a diameter of 0.631". This provided a total gap 32 between channel 24 and tube 30 of about 0.006" at room temperature, sufficient to enable the above described differential expansion seal system.

In order to provide a gas/vapor seal between bottom member 16 and flange 18 of side wall 14, a high temperature seal material or cement 34 was placed therebetween, as shown in FIG. 1. One type of seal material which has been used successfully is commercially available as Graphoil material, available from Carbone of America Co.

Figure 2:
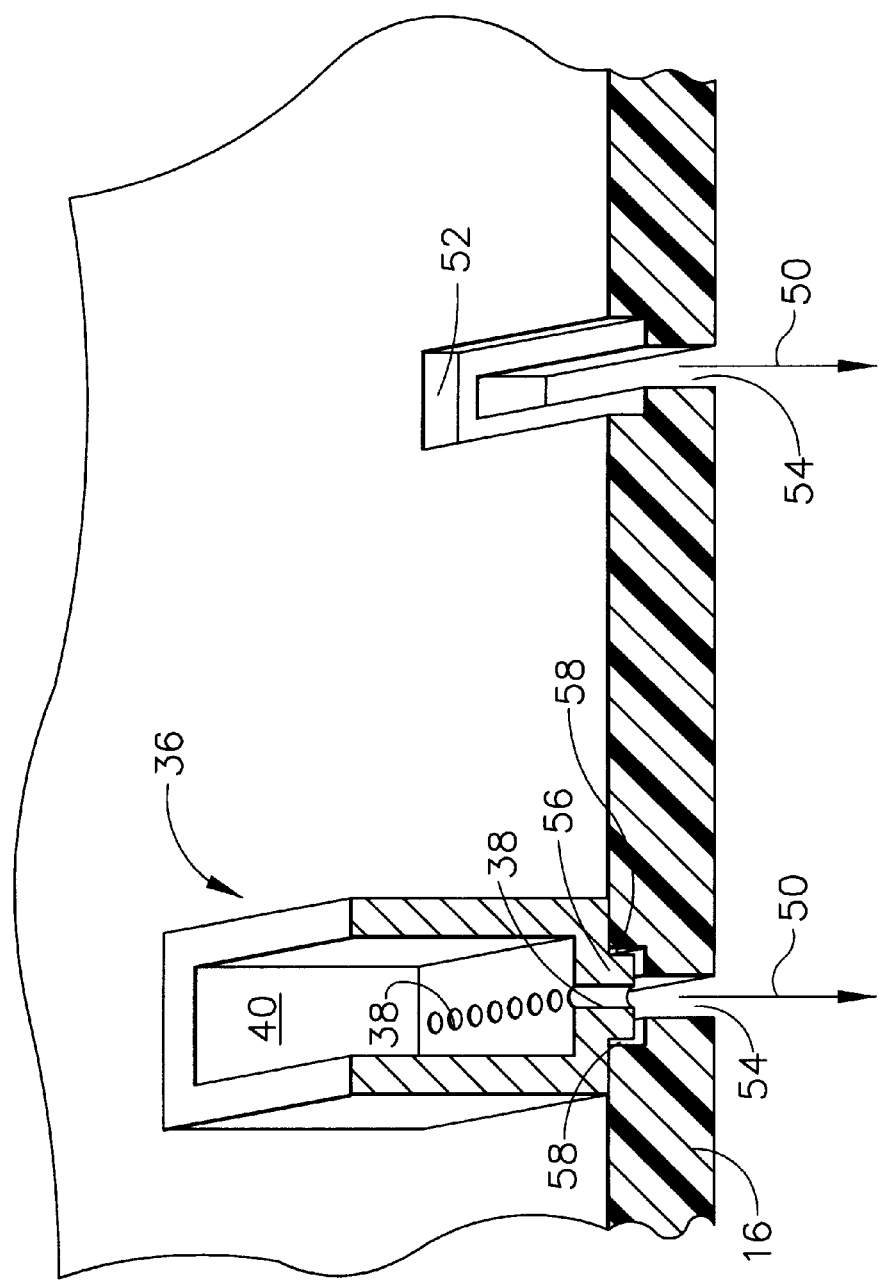
FIG. 2 is a fragmentary sectional view of a portion of the bottom member of the coating container of FIG. 1 showing a workpiece holder in place within a slot in the bottom member.

One or more workpieces to be coated, for example typical air cooled gas turbine engine turbine blades including internal air cooling passages, are held within hollow interior 20 by one or more workpiece holders shown generally at 36 in the drawings. Two of the holders are shown in FIG. 1, and one is shown in the fragmentary sectional view of FIG. 2. However, in practice, coating container 10 is adapted to hold many workpieces appropriately arranged for coating, for example in spaced apart circular rows. In the form shown in the drawings, workpiece holders 36 are constructed with at least one opening 38 in holder base 40 to hold the blades, represented by a portion of a blade shown generally at 42, for example with its dovetail 44 adjacent opening 38. This enables flow of coating vapor, introduced into an opening in a top portion of the blade, to pass through the blade internal cooling passages, represented by hidden channel 46, for the coating of walls of internal cooling passages of the blade. In FIG. 1, flow arrow 48 represents the inlet flow of gas, or in one form gas and coating vapor into container 10: and flow arrow 50 represents the outlet flow of gas and coating vapor from container 10, after passing through the internal passages of the blades.

Prior to coating, workpieces such as blades 42 generally are assembled each within a workpiece holder 36 for placement within container 10. In order to hold the workpieces securely within container 10 during coating and to facilitate removal of the workpieces and their respective holders after coating, a differential expansion seal system as generally described above is provide, in one form of the present invention, between bottom member 16 and workpiece holder 36. In the form shown in the drawing, and in more detail in FIG. 2, such a differential expansion seal system includes a slot 52 in bottom member 16. A recess 52 in the form of a slot includes an opening 54 through bottom member 16 to allow gas and coating vapor which has passed through the workpiece, as described above, to exit container 10. Cooperating in the releasable seal with slot 52 is a protuberance 56 of holder 36. As was described above in connection with the releasable seal between channel 24 and tube 30 to provide registry therebetween, slot 52 and protuberance 56 are shaped to match one another across gap 58. In the example shown in the drawings with bottom member 16 made of graphite, the material of workpiece holder 36 was made of a commercial cobalt base high temperature alloy sometimes called X-40 alloy. A gap 58 was provided, in one dimension, at a total of 0.004" to enable the above described releasable differential expansion seal to function between workpiece holder 36 and bottom member 16. Therefore, one form of the present invention provides a releasable differential expansion seal for a gas/vapor inlet connection and another releasable differential expansion seal at a juncture between a workpiece holder and a bottom member of the container.

The present invention has been described in connection with specific examples and embodiments which are intended to be typical of rather than in any way limiting on the scope of the present invention. For example, although a nonmetallic, dimensionally stable, nonreactive material like graphite is specifically preferred for the material of the coating container for use within a furnace, because of its good heat transfer characteristics, other nonmetallic materials can be used for other applications. Those skilled in the arts associated with this invention will understand that it is capable of variations and modifications without departing from the scope of the appended claims.

What is claimed is:

1. A high temperature vapor coating container including a container hollow interior, means to provide a coating vapor within the hollow interior, and means to hold at least one workpiece within the hollow interior; wherein:

the container is made of a nonmetallic material which:
  a) has a coefficient of thermal expansion of less than about $4.5 \times 10^{-6}$ at a vapor coating temperature of at least about 1700° F. to enable the container to resist distortion and cracking at the vapor coating temperature; and,
  b) is nonreactive with the coating vapor at the coating temperature.

2. The coating container of claim 1 which comprises:
  a top, a side wall carrying the top, and a bottom portion;
  the top side wall and bottom portion cooperating to define a container hollow interior;
  means to provide a coating vapor within the hollow interior; and,
  means to hold at least one workpiece within the hollow interior;
  the top, side wall and bottom portion being made of the nonmetallic material.

3. The coating container of claim 2 in which the nonmetallic material is graphite for each of the top, the side wall and the bottom portion.

4. The coating container of claim 2 which includes means to introduce a fluid into the hollow interior, wherein the means to introduce the fluid comprises:
  a first member having a first fluid flow passage therethrough, made of a first material having a first coefficient of thermal expansion and having a first cross sectional shape and a first cross sectional size;
  a second member, assembled with the first member, the second member having a second fluid flow passage therethrough, made of a second material having a second coefficient of thermal expansion of a difference from the first coefficient of thermal expansion, the second fluid flow passage having a second cross sectional shape substantially the same as the first cross sectional shape and a second cross sectional size at an ambient temperature different from the first cross sectional size by an amount which, when the first and second members are assembled one within the other at the ambient temperature, a gap is provided therebetween;
  the difference between the first and second coefficients of thermal expansion being one which will result in substantial closure of the gap between the members at the vapor coating temperature higher than the ambient temperature and will reestablish the gap at the ambient temperature to define a releasable differential expansion seal between the first and second members.

5. The container of claim 4 in which:
  the first member is a tube of a first metal having a substantially circular external cross section and a first external cross sectional size; and,
  the second member includes an internal fluid flow passage of substantially circular cross section and of an internal cross sectional size larger at the ambient temperature than the external cross sectional size of the first member to receive the first member within the passage with the gap therebetween at the ambient temperature.

6. The container of claim 2 which includes at least one workpiece holder within the container hollow interior carried by the container bottom portion, wherein:
  the workpiece holder is made of a holder material having holder coefficient of thermal expansion, the holder including a first connector means of a first connector shape;
  the bottom portion, made of the nonmetallic material, has a nonmetallic material coefficient of thermal expansion of a difference from the holder coefficient of thermal expansion, the bottom portion including a second connector means of a second connector shape matched with but of a different size from the first connector shape at an ambient temperature to enable the first and second connector means to be assembled one within the other at the ambient temperature and a gap is provided therebetween;
  the difference between the holder coefficient of thermal expansion and the nonmetallic material coefficient of thermal expansion being one which will result in substantial closure of the gap between the first and second connector means at the vapor coating temperature higher than the ambient temperature and will reestablish the gap at the ambient temperature to define a releasable differential expansion seal between the first and second connector means.

7. The container of claim 6 in which:
  the first connector means is a protuberance from the workpiece holder; and
  the second connector means is a recess in the bottom portion.

* * * * *